INTERSTAGE COUPLING AND NEUTRALIZATION CIRCUIT
Filed May 10, 1965
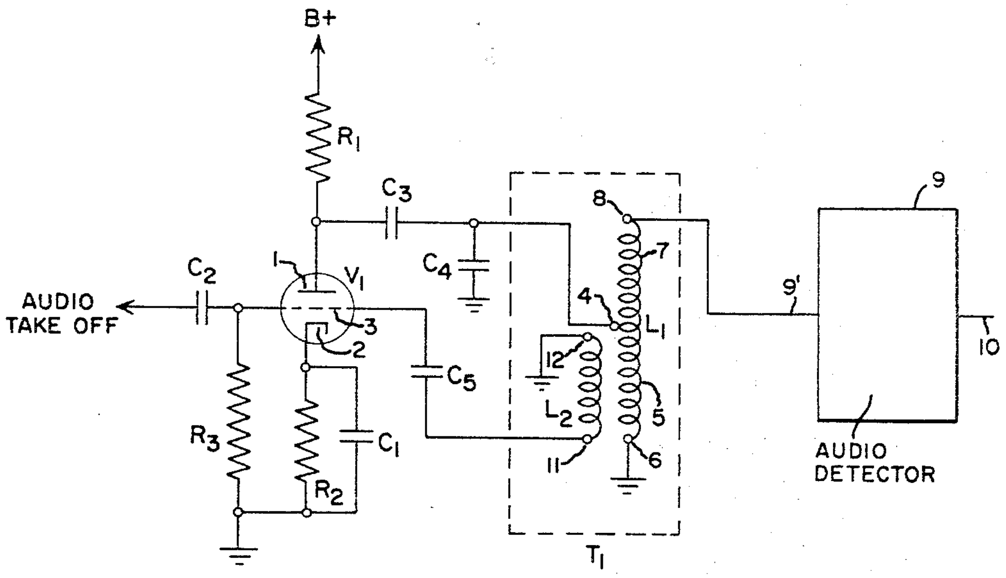
INVENTOR:
VAN R. GIBSON, JR.
BY William S. Wolfe
HIS ATTORNEY.

United States Patent Office 3,435,133
Patented Mar. 25, 1969

3,435,133
INTERSTAGE COUPLING AND NEUTRALIZATION CIRCUIT

Van R. Gibson, Jr., Baldwinsville, N.Y., assignor to General Electric Company, a corporation of New York Filed May 10, 1965, Ser. No. 454,401
Int. Cl. H04n *7/00;* H03f *1/00;* H01h *7/08*
U.S. Cl. 178—5.6 5 Claims

ABSTRACT OF THE DISCLOSURE

In order to provide for coupling and neutralization in multi-stage circuits there is provided an autotransformer having a primary portion and a secondary portion. Magnetically coupled to the autotransformer is a second winding wound in bifilar fashion with the primary portion to derive a signal equal in amplitude to the output of a first stage, but out of phase with that signal. This signal is then fed back to the input of the first stage to exactly balance the signal feedback to that input due to interelectrode capacity in the first stage. The output of the autotransformer is supplied as an input to a succeeding stage.

The present invention relates to interstage circuitry and more specifically to improved interstage circuitry for providing both coupling and neutralization.

Triode amplifiers are often employed in electronic equipment, the output of such triode amplifiers being coupled to succeeding stages by various interstage coupling circuits. However, when employing a triode as an amplifier, it becomes necessary in many applications to neutralize the signal inherently fed back from the plate to the grid of the tube due to interelectrode capacity. For example, it is common in television receivers to employ an intercarrier sound system utilizing a triode amplifier to amplify an audio modulated 4.5 megacycle signal prior to the application of the signal to a suitable detector. It is found in such a system that neutralization of the triode amplifier must be provided in order to prevent self oscillation thereof.

In the past, the coupling between the triode amplifier and the next succeeding stage and the neutralization of the triode amplifier have required the use of relatively critical and thus expensive circuit elements. Specifically, in the interstage coupling circuit employed in the television circuit discussed above, a $\pi$ coupling network is conventionally utilized comprising a first inductance with capacitors connected to ground at each end thereof. One end of the first inductance is coupled to the anode of the triode amplifier while the opposite end is connected to the grid of the next succeeding stage. Neutralization is effected through the use of a second discrete inductance, the second inductance being center-tapped to provide the necessary out-of-phase neutralization voltage. One end of the second inductance is connected to the input of the coupling network while the opposite end is connected through a neutralization capacitor to the grid of the triode amplifier and the center tap is grounded.

Several disadvantages are exhibited by the above-described prior art circuit. Initially, in order to provide an out-of-phase neutralization voltage of the proper magnitude the center tap of the second inductance must be positioned with a relatively high degree of precision. Also, since errors in placement of the center tap and variations in the value of the neutralization capacitor are cumulative, a relatively expensive capacitor exhibiting low tolerances must be employed. Further, the necessity for utilizing two discrete inductances greatly adds to the size and complexity of the interstage circuitry.

Accordingly, it is an object of the invention to provide improve interstage circuitry for use with triode amplifiers.

Another object is to provide improved interstage circuitry which provides both coupling and neutralization.

Yet another object is to provide an improved interstage coupling and neutralization circuit which employs less critical circuit elements than the prior art circuits.

Still another object is to provide improved interstage coupling and neutralization circuitry which eliminates the necessity for a plurality of discrete inductances.

These and other objects are achieved in one embodiment of the invention through the use of an autotransformer to provide the necessary coupling. The autotransformer includes a first winding having a primary portion and a secondary portion, the primary portion being at least partially common to the secondary portion. The autotransformer further includes a second winding wound in bifilar fashion with the primary portion of the first winding and being magnetically coupled thereto. The primary portion of the first winding is connected to the anode of the triod amplifier and the secondary portion is connected to the grid of the next succeeding stage. A neutralization voltage is applied to the grid of the triode amplifier by connecting the second winding thereto. Since the second winding has the identical number of turns as the primary portion of the first winding with which it is wound, an equal and opposite neutralization voltage is derived from the second winding which exactly balances the internal feedback in the triode amplifier.

The novel and distinctive features of the invention are set forth in the appended claims. The invention itself, together with further objects and advantages thereof, may best be understood by reference to the following description and accompanying drawing in which:

The single feature is a schematic diagram of the interstage coupling and neutralization circuit of the invention.

Referring to the figure there is shown an improved interstage coupling and neutralization circuit $T_1$ in accordance with the invention. The interstage circuit $T_1$ is utilized to both couple the output of a triode amplifier $V_1$ to the input of a succeeding stage, the succeeding stage being in this instance the detector 9 of a television receiver intercarrier sound system, and to develop a neutralization voltage for the triode amplifier $V_1$.

The triode amplifier $V_1$ includes anode, cathode, and control grid electrodes 1, 2 and 3 respectively. An operating voltage is applied to the anode 1 via a dropping resistor $R_1$. The operating point of the triode amplifier is established by a resistor $R_2$ bypassed by a capacitor $C_1$ connected between the cathode 2 of the triode amplifier $V_1$ and ground. A coupling capacitor $C_2$ is employed to couple the 4.5 mc. signal from the audio takeoff to the grid 3 of triode amplifier $V_1$, a grid leak resistor $R_3$ being connected between the grid 3 and ground in conventional fashion.

The interstage circuit $T_1$ generally comprises a first winding $L_1$, the winding $L_1$ being tapped at 4 to define a first winding portion 5 between end 6 and tap 4 and a second winding portion 7 between end 8 and tap 4. A movable core is provided for tuning the winding $L_1$ in conventional fashion. The winding portion 5 comprises the primary of an autotransformer, the secondary of the transformer including the winding portion 5 which is common to both the primary and secondary and the winding portion 7.

The signal at the anode 1 of triode amplifier $V_1$ is coupled through a coupling capacitor $C_3$ to the tap 4 of winding $L_1$, the ends 6 and 8 of winding $L_1$ being connected to the input terminal or lead 9' of the succeeding stage 9 and ground respectively. The tap 4 of winding $L_1$ is returned to ground through a capacitor $C_4$ which in conjunction with the input capacitance of stage 9 serves to tune the interstage circuit to 4.5 mc. The signal at the input terminal or lead 9' of stage 9 is detected through the action of suitable means provide a detected audio signal at the output terminal as lead 10 of stage 9. The specific audio detector used in conjunction with this invention may take any number of forms, by way of illustration, reference is made to page 583 of the book Fundamentals of Television Engineering by Glenn M. Glasford, the McGraw-Hill Book Company, Inc., 1955. Obviously, any audio detector or detector of any kind or first stage of amplification could be the second stage which is coupled by the interstage circuit $T_1$ to a preceding stage.

In accordance with the invention a second winding $L_2$ is wound in bifilar fashion with winding portion 5 and magnetically coupled thereto to provide a voltage across $L_2$ which is 180° out-of-phase with the voltage of the anode 1 of triode amplifier $V_1$. The term "bifilar" as utilized throughout this specification refers to a winding arrangement wherein first and second conductors are wound simultaneously as a pair so that the resultant windings have identical numbers of turns.

The out-of-phase voltage developed across $L_2$ is utilized to neutralize the triode amplifier $V_1$ by connecting the end 11 of winding $L_2$ to the grid 3 of triode amplifier $V_1$ through a neutralization capacitor $C_5$, the end 12 of winding $L_2$ being grounded.

The depicted circuit operates in the following manner. The 4.5 mc. signal is applied to the grid 3 of the triode amplifier $V_1$, an amplified 4.5 mc. signal accordingly appearing at the anode 1. The amplified 4.5 mc. signal is coupled through the interstage circuit $T_1$ to the input terminal or lead 9' of 9 which in conjunction with appropriate circuitry provides a detected audio signal at the output terminal or lead 10. The interstage circuit $T_1$ is tuned to selectively pass the 4.5 mc. signal by proper selection of the winding $L_1$ in conjunction with the capacitor $C_4$ and the input capacitance of the stage 9. The interstage circuit $T_1$ further serves as a tuned grid circuit in conjunction with a detector wherein oscillations are achieved through use of a tuned grid circuit. The position of the tap 4 with respect to the winding $L_1$ serves to provide a desired voltage stepup and impedance matching between the stages $V_1$ and 9. It will be appreciated that under some circumstances a step down might be desired in which case the entire winding $L_1$ would comprise the primary of the autotransformer, the input terminal or lead 9' of stage 9 being connected to an intermediate point of the winding $L_1$. In this situation the winding $L_2$ would be wound in bifilar fashion with the entire winding $L_1$.

Itis found in a triode amplifier such as $V_1$ that the amplified signal at the anode 1 is inherently fed back to the control grid 3 due to interelectrode capacity. Since the audio take-off from which the signal applied to the grid 3 is derived, generally comprises a high impedance tuned circuit such feedback unless neutralized results in spurious operation of the triode amplifier. The necessary neutralization is achieved in accordance with the invention by the developing of out-of-phase neutralization voltage at the end 11 of winding $L_2$. Since the winding $L_2$ is wound in bifilar fashion with the winding portion 5 of winding $L_1$ the voltage at end 11 is exactly equal and opposite to that at tap 4. The neutralization voltage thus developed is then coupled through a neutralization capacitor $C_5$ to the grid 3 of stage $V_1$ to exactly balance the signal fed back to the control grid 3 due to interelectrode capacity.

By winding $L_2$ in bifilar relationship to the winding portion 5 the prior art problems relating to precise positioning of a center tap are eliminated. Thus, since the number of turns of winding $L_2$ and winding portion 5 of winding $L_1$ are inherently equal, the exact placement of the tap 4 is much less critical than in the prior art circuit. Accordingly, the interstage circuit $T_1$ is less expensive than the prior art circuit. Further, since the placement of the tap 4 of the interstage circuit $T_1$ is not critical, a less expensive neutralization capacitor $C_5$ can be employed since errors in placement of the tap need not be taken into account and the tolerance requirements of neutralizing can accordingly be lessened. Even further, through the use of the interstage circuit $T_1$ of the invention the necessity for a plurality of discrete inductances is eliminated, the circuit of the invention accordingly being smaller in size and less complex than the prior art circuit.

Although the invention has been described with respect to certain specific embodiments, it will be appreciated that modifications and changes may be made by those skilled in the art without departing from the true spirit and scope of the invention. Specifically, although the invention has been related to the intercarrier sound system of a television receiver, it will be appreciated that the invention is not limited to this particular application.

What is claimed and desired to be secured by Letters Patent of the United States is:

1. An interstage coupling circuit for coupling the output of a first stage to the input of a second stage, said circuit comprising;

(a) an autotransformer having a first winding including a primary portion and a secondary portion, said primary portion being at least partially common to said secondary portion, (b) said autotransformer further having a second winding wound in bifilar fashion with the primary portion of said first winding and being magnetically coupled thereto, (c) means connecting said primary portion of said first winding to the output of the first stage, (d) means connecting said secondary portion of said first winding to the input of the second stage, and (e) means connecting said second winding to the first stage to apply a neutralization voltage thereto.

2. An interstage coupling circuit for coupling the output of a first stage including a triode amplifier having input and output electrodes to the input of a second stage, said circuit comprising;

(a) a first winding connected between the input of the second stage and ground, (b) means connecting the output electrode of the triode to an intermediate point of said first winding, (c) a second winding wound in bifilar fashion with the portion of said first winding between said intermediate point and ground and being magnetically coupled thereto, and (d) means connecting said second winding to the input electrode of the triode amplifier to apply a neutralization voltage thereto.

3. The circuit defined in claim 2 wherein said means connecting said second winding to the input electrode of the triode amplifier includes a capacitor.

4. The interstage coupling circuit defined in claim 2 including capacitive means in parallel with said first winding to tune said first winding to a desired frequency.

5. An audio circuit for a television receiver, said circuit comprising:

(a) a triode amplifier having anode, cathode and grid electrodes;

(b) an audio detector having input and output terminals;

(c) a first winding connected between said input terminal and ground;

(d) capacitive means connecting the anode of said triode amplifier to an intermediate point of said first winding;

(e) a second winding wound in bifilar fashion with the portion of said first winding between said intermediate point and ground and being magnetically coupled thereto;

(f) capacitive means connecting said second winding to the grid electrode of said triode amplifier to apply a neutralization voltage thereto;

(g) means connecting an audio modulated signal to said grid electrode of said triode; and (h) means for deriving a detected audio signal from said output terminal.

References Cited

UNITED STATES PATENTS

| | | | |
|---|---|---|---|
| 2,729,796 | 1/1956 | Hulst | 333—78 |
| 2,775,656 | 12/1956 | Hounsfield | 30—177 |

ROBERT L. GRIFFIN, *Primary Examiner.*

ALFRED H. EDDLEMAN, *Assistant Examiner.*

U.S. Cl. X.R.

330—177; 333—78